(12) United States Patent
Bisanti et al.

(10) Patent No.: US 6,600,351 B2
(45) Date of Patent: Jul. 29, 2003

(54) LOOP FILTER ARCHITECTURE

(75) Inventors: Biagio Bisanti, Antibes (FR); Stefano Cipriani, Vallauris (FR); Francesco Coppola, Antibes (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/072,094

(22) Filed: Feb. 8, 2002

(65) Prior Publication Data
US 2003/0025538 A1 Feb. 6, 2003

(30) Foreign Application Priority Data

Jul. 31, 2001 (EP) .............................. 01402070

(51) Int. Cl.$^7$ ................................ H03L 7/06
(52) U.S. Cl. ........................ 327/157; 327/148
(58) Field of Search ................... 327/155, 156, 327/157, 147, 146, 148; 331/17, DIG. 2, 25; 375/294, 375, 376

(56) References Cited

U.S. PATENT DOCUMENTS

| 5,347,233 | A | * | 9/1994 | Ishibashi et al. | 331/2 |
| 5,592,120 | A | | 1/1997 | Palmer et al. | 327/536 |
| 5,740,213 | A | * | 4/1998 | Dreyer | 331/2 |
| 5,949,264 | A | * | 9/1999 | Lo | 375/374 |
| 6,064,274 | A | | 5/2000 | Nayebi et al. | 331/17 |
| 6,262,634 | B1 | * | 7/2001 | Flanagan et al. | 331/25 |

FOREIGN PATENT DOCUMENTS

GB        2 336 482 A     10/1999

* cited by examiner

Primary Examiner—Timothy P. Callahan
Assistant Examiner—Linh Nguyen
(74) Attorney, Agent, or Firm—Ronald O. Neerings; Wade James Brady, III; Frederick J. Telecky, Jr.

(57) ABSTRACT

A phase-lock loop (PLL) filter architecture includes a first charge pump (508) and a second change pump (510). The second charge pump (510) operates in opposite phase of the first charge pump (508) in order to take away excess charge from the loop filter capacitor(s). By using a second charge pump as described, the PLL filter does not require the use of a large capacitor and can therefore be integrated.

8 Claims, 3 Drawing Sheets

LOOP FILTER ARCHITECTURE

TECHNICAL FIELD

This invention relates in general to the field of filters, and more specifically to a PLL loop filter that can be integrated. The loop filter can be used in a fully integrated PLL design such as a PLL synthesizer, etc.

BACKGROUND

The biggest component in a type 2 PLL (using a three-state charge-pump) is the capacitor that provides the zero in the PLL transfer function. Given this capacitor's typical large capacitance value, it is not possible to integrate it, which in turn adds extra cost in manufacturing the PLL circuit. A need thus exist in the art for a filter architecture that allows for the integration of this capacitor and therefore provides for improved and manufacturability of the PLL.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
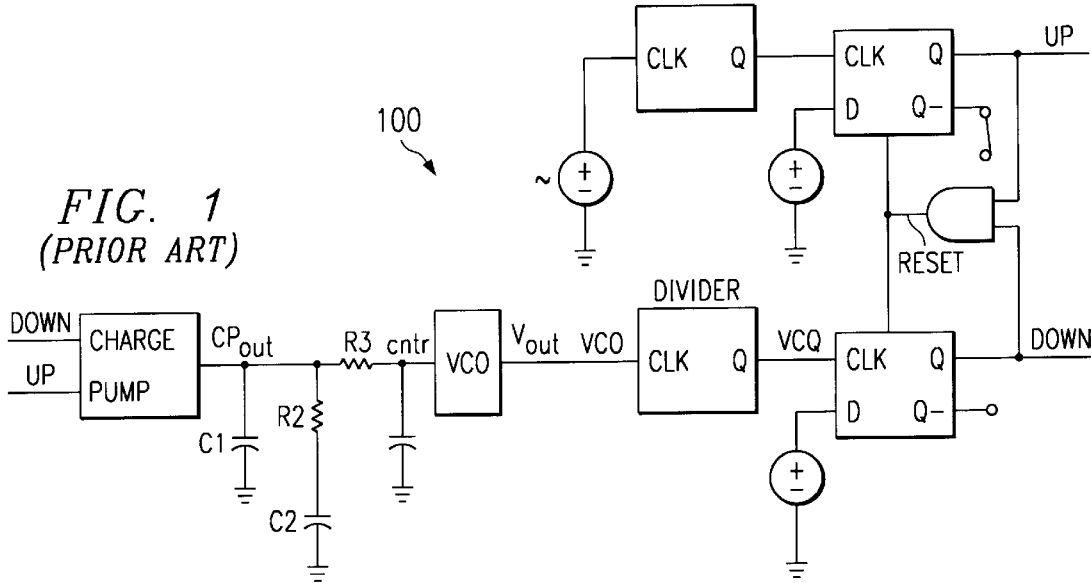
FIG. 1 shows a block diagram of a prior art radio frequency synthesizer.

The present invention provides a way of reducing the value of the passive components used in a filter such as a type two, third order PLL loop filter. This in turn allows in many cases the complete integration of the loop filter. The architecture proposed in the preferred embodiment uses two charge-pumps that work with opposite phase and different values. Generally, in the invention an on-chip current source (e.g., charge pump) provides the functionality of a large value (non-integratable) capacitor in a filter.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is shown a schematic of a prior art radio frequency (RF) synthesizer architecture 100. The series resistor R2 and capacitor C2 provides a zero in the loop filter during the transient. The large value capacitor, C2 works like a big accumulator that receives any excess charge given from the charge pump to the capacitor C1. Capacitor C1 is generally an order of magnitude smaller than capacitor C2. Since capacitor C2 is located in parallel to the charge pump, it receives almost all the charge given by the charge pump. When the charge pump is in its third state, any excess charge is shared among all the capacitors (C1 and C2), with the time constant defined by the values of the capacitors and resistors.

In accordance with the present invention, capacitor C2 in FIG. 1 is eliminated or at least its value reduced enough so that it can be integrated into an integrated circuit. This is accomplished by using an additional current source such as a charge pump that works in the opposite phase as the charge pump in FIG. 1. It is worth noting that the complete elimination of capacitor C2 is not necessary, what is required is the reduction of its capacitance value enough so that it can be integrated. To show how this is accomplished, two loop filters are reviewed. The first loop filter is the one used in FIG. 1 and is highlighted in FIG. 2A, and the new loop filter in accordance with the invention is shown in FIG. 2B.

Figure 2A:
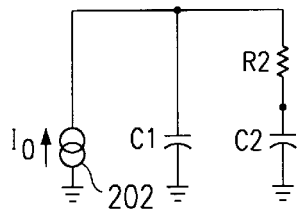
FIG. 2A shows an electrical model of a prior art loop filter.
Figure 2B:
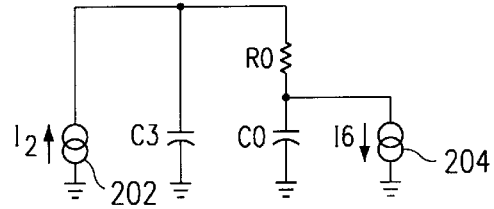
FIG. 2B shows an electrical model of a loop filter in accordance with the invention.

If the same current pulse is applied to the circuits in FIGS. 2A and 2B we will need to calculate the pulse of current of the same length but opposite phase to be given to the circuit in FIG. 2B, shown by current 16, in order to get the same output voltage variation for the two circuits in the steady state condition of the capacitor, where C=C2/K. Given this, we set $I_0=I_2$, C3=C1 and C2=K*C0. This gives the result of:

$$\frac{I_6}{I_0} = \frac{K-1}{k}.$$

If for example, we want to reduce the capacitance value of capacitor C2 by a factor of 10, we have to use a current $I_6=0.9I_0$.

Figure 3:
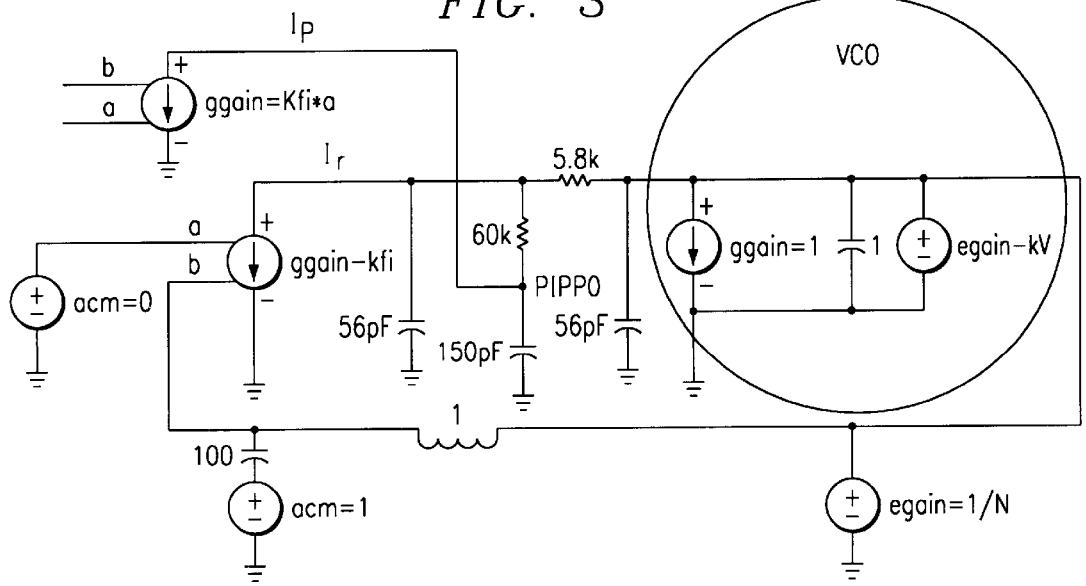
FIG. 3 shows an AC simulation model used in simulating the present invention.
Figure 5:
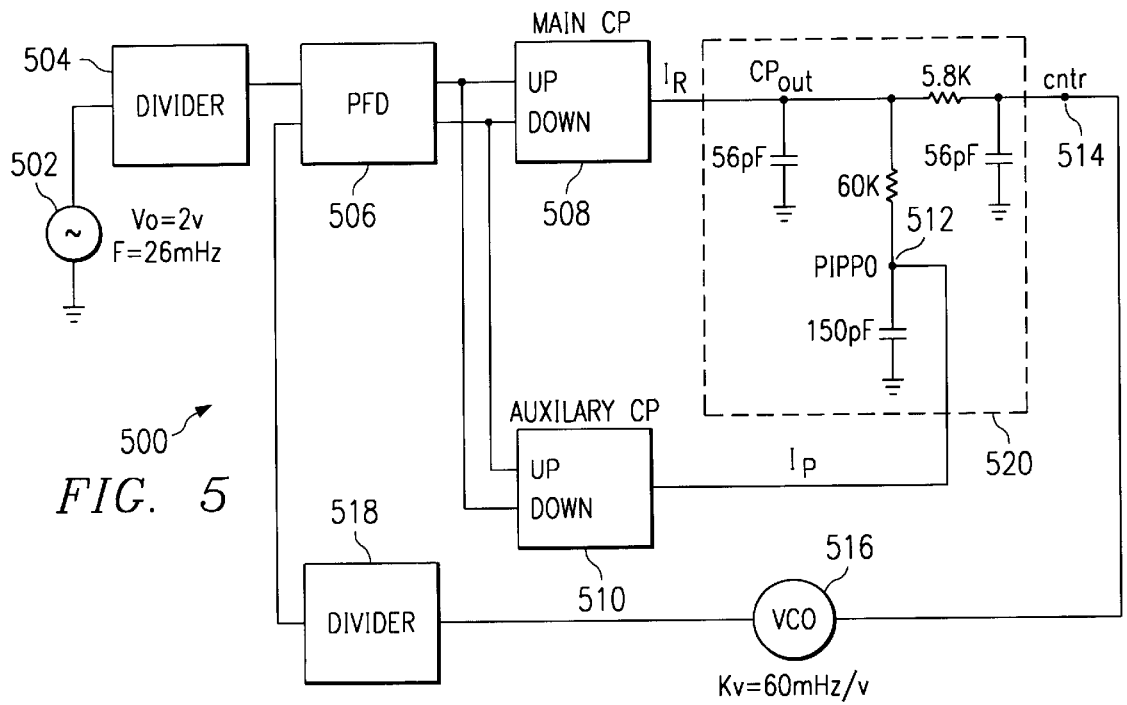
FIG. 5 shows a transient simulation model that uses the same PLL parameters as those used in the AC simulation model of FIG. 3 in accordance with the invention.

The above result is proved using two simulation models of a PLL loop used in an synthesizer, one model is for the open loop AC simulation used to test the loop stability which is shown in FIG. 3. A second model is used for a transient simulation which is shown in FIG. 5. In the AC model shown in FIG. 3, the main charge pump providing current Ir works in opposite phase compared with an auxiliary charge pump providing current Ip and exchanges charge with the loop filter though the node labeled "PIPPO." The parameters used with the AC model of FIG. 3 include, Icp=400 microampere (uA), Kv=60 MHzN, a=0.75 and N=2000. The values of all the capacitors used in the loop filter are small enough to be capable of being integrated. For example, as shown in the embodiment of FIG. 5, loop filter 520 includes two 56 pico-Farad (pF) capacitors, one 150 pF capacitor, one 5.8 Kilo-ohm resistor and one 60 kilo-ohm resistor, with the PIPO node 512 located between the 60K resistor and the 150 pF capacitor.

Figure 4A:
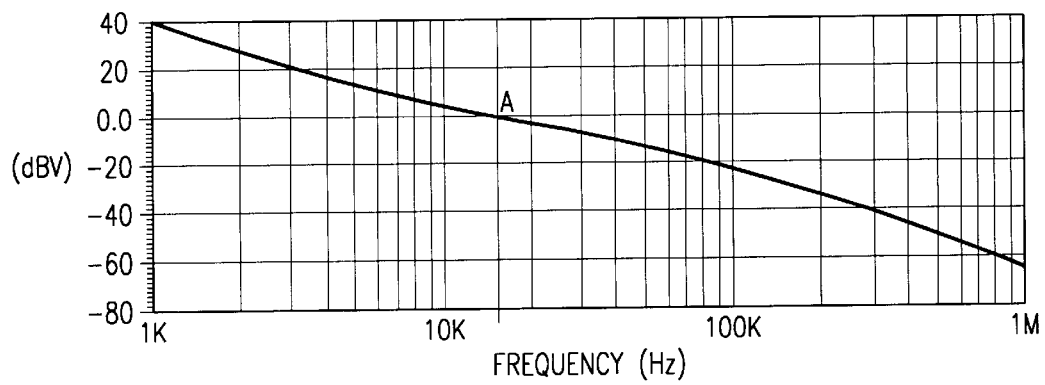
FIGS. 4A and 4B show the AC response of the simulation model of FIG. 3.
Figure 4B:
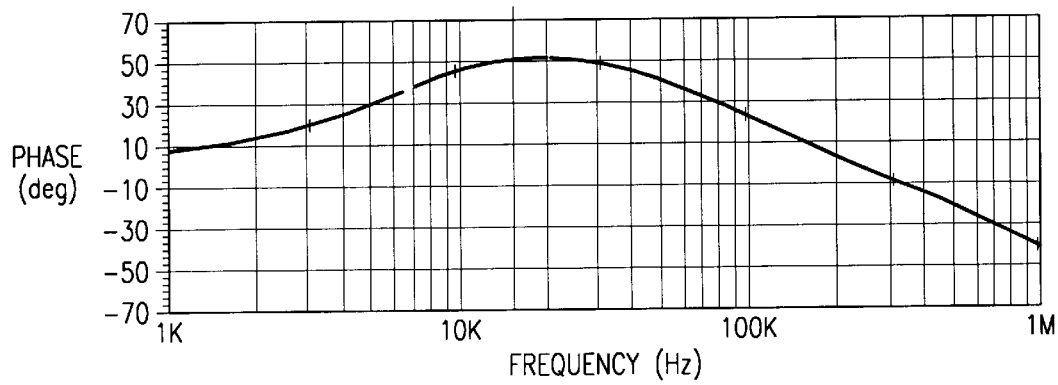

Results for the AC model shown in FIG. 3 are shown in FIGS. 4A and 4B. In FIG. 4A the AC response in dB (decibels) versus frequency (Hertz) is shown, while in FIG. 4B the relationship of phase (degrees) versus frequency (Hertz) is shown. The simulation results show that the PLL is stable with 50 degrees of phase margin and 15 kHz of bandwidth.

In FIG. 5 there is shown a RF synthesizer used for transient simulation model. The PLL parameters used for this model are the same used in the AC simulation in FIG. 3. The radio frequency synthesizer model 500 shown in FIG. 5 includes an oscillator 502. The output of the oscillator is then coupled to a divider 504 for reducing the frequency of the signal. A phase/frequency detector (PFD) 506 has an input port for receiving the output signal from divider 504. A main charge pump (CP) 508 is then coupled to the outputs of PFD 506, while a current source in the form of a second auxiliary charge pump 510 is coupled at its inputs in opposite fashion to CP 508 so that it can operate in opposite phase to CP 508.

Synthesizer 500 includes a loop filter section 520 in accordance with the invention section that uses a second charge pump 510 in order to reduce the value of one of the capacitors of the loop filter so that it may be integrated. A conventional VCO 516 is then coupled to the output of the loop filter and a second divider 518 is coupled between the VCO output and the return loop input to the PFD 506.

Figure 6A:
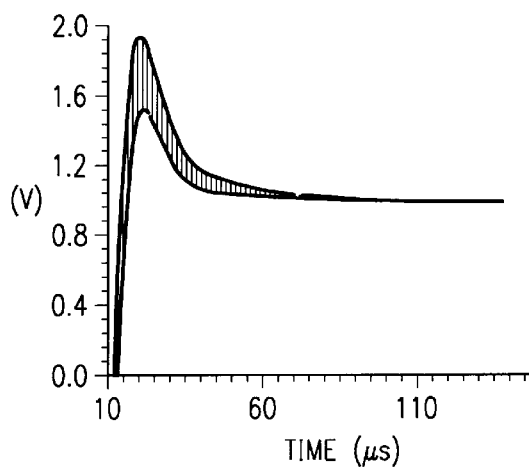
FIG. 6A shows a transient response simulation data at node CPout of FIG. 5.
Figure 6B:
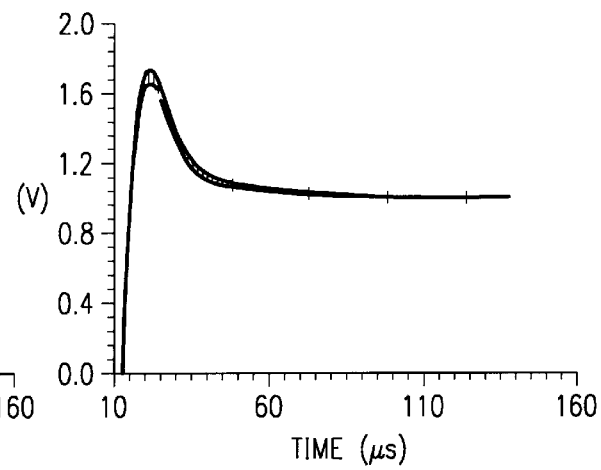
FIGS. 6B and 6C show transient response simulation data at node "cntr" of FIG. 5.
Figure 6C:
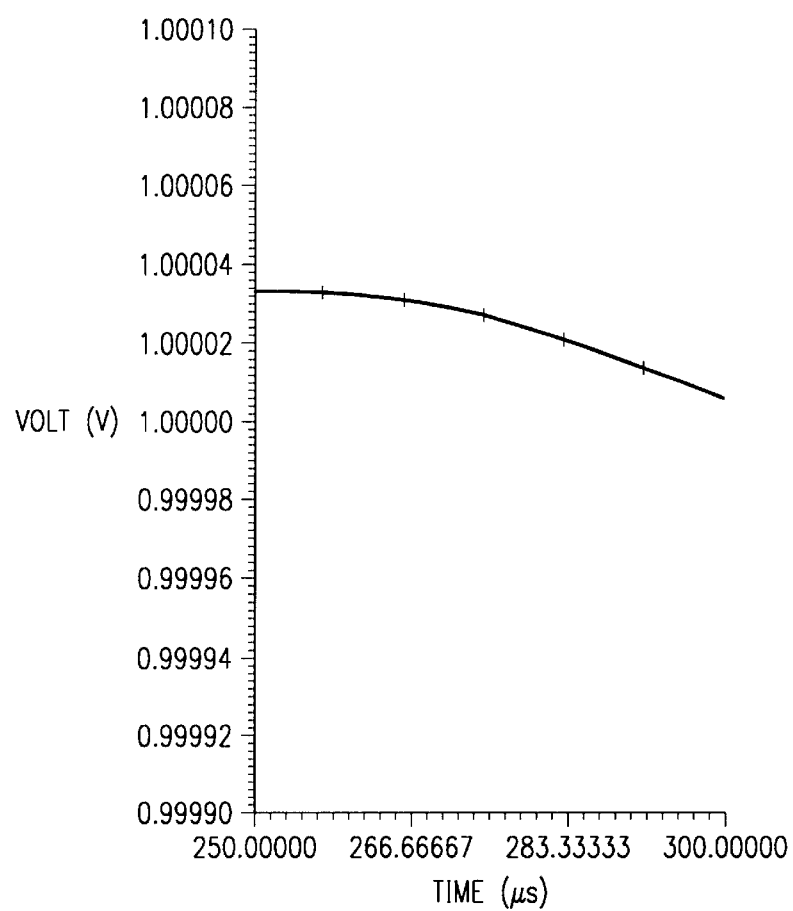

The results of the transient simulation model of FIG. 5 are shown in FIGS. 6A–6C. FIG. 6A shows the transient response at node CPout while FIGS. 6B and 6C show the transient response at node "cntr" 514. Although looking at the transient simulation data of FIG. 6C 300 it is is not enough to lock the PLL in-phase, the control voltage at that point is very close to the final steady state voltage at the PLL locked condition.

The present invention provides a solution to the problem of how to integrate the large capacitor found in a filter such as some types of PLL loop filters. The invention allows for the reduction of at least a factor of 10 the size of the capacitor used, by using an a current source such as an auxiliary charge pump matched with the main one, but operating with opposite phase. Allowing for the integration of the loop filter's large capacitor, in turn allows for the design of a fully integrated PLL or RF synthesizer that are typically less expensive to manufacture than those using a prior art design requiring an off-chip capacitor. By using a second charge pump and no other active components, means less noise sources and hence better phase noise performance.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A phase-lock-loop (PLL) architecture comprising:
 a loop filter having at least one capacitor;
 a first charge pump coupled to the loop filter; and
 a second charge pump coupled to the loop filter, said second charge pump operating in substantially opposite phase to said first charge pump in order to reduce the value of the capacitor.

2. A PLL architecture as defined in claim 1, wherein the loop filter comprises:
 an input port;
 a first capacitor coupled to said input port;
 a first resistor coupled to said input port;
 a second capacitor coupled to the first resistor, said first resistor and second capacitor coupled in parallel to said first capacitor.

3. A phase-lock-loop (PLL) architecture comprising:
 a loop filter having at least one capacitor, the loop filter further including:
  an input port;
  a first capacitor coupled to said input port;
  a first resistor coupled to said input port; and
  a second capacitor coupled to the first resistor, said first resistor and second capacitor coupled in parallel to said first capacitor;
 a first charge pump coupled to the loop filter; and
 a second charge pump coupled to the loop filter, said second charge pump operating in substantially opposite phase to said first charge pump in order to reduce the value of the capacitor, and the first charge pump is coupled to the loop filter's input port and the second charge pump is coupled between said first resistor and said second capacitor.

4. A PLL architecture as defined in claim 3, further comprising a voltage-controlled oscillator coupled to the loop filter.

5. A PLL architecture as defined in claim 3, wherein the loop filter comprises a type 2 PLL loop filter.

6. An integratable filter, comprising:
 a first current source;
 a filter section having an input and said first current source is coupled to the input,
 said filter section including at least one capacitor; and
 a second current source operating in opposite phase to the first current source and coupled to the at least one capacitor in order to reduce any excess charge applied to the at least one capacitor.

7. An integratable filter as defined in claim 6 wherein said first and second current sources comprise charge pumps.

8. An integratable filter as defined in claim 7, wherein said filter section comprises a loop filter.

* * * * *